(12) United States Patent
Xu

(10) Patent No.: US 7,759,407 B2
(45) Date of Patent: Jul. 20, 2010

(54) COMPOSITION FOR ADHERING MATERIALS TOGETHER

(75) Inventor: Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 1043 days.

(21) Appl. No.: 11/187,406

(22) Filed: Jul. 22, 2005

(65) Prior Publication Data

US 2007/0021520 A1    Jan. 25, 2007

Related U.S. Application Data

(62) Division of application No. 11/187,407, filed on Jul. 22, 2005.

(51) Int. Cl.
*C08F 2/46* (2006.01)
*C08J 3/28* (2006.01)
*B05D 5/10* (2006.01)
*B05D 5/00* (2006.01)

(52) U.S. Cl. .......... 522/143; 522/134; 522/135; 522/141; 522/144; 522/145; 522/146; 522/162; 522/166; 522/4; 522/1; 156/272.2; 156/273.3; 427/207.1; 427/208; 427/208.2; 427/208.4; 427/208.8; 427/457; 427/508; 427/516

(58) Field of Classification Search ............ 522/134, 522/135, 145, 162, 166, 4, 1, 146, 141; 156/272.2; 427/207.1, 208, 208.2, 208.4, 508, 457, 516
See application file for complete search history.

(56) References Cited

U.S. PATENT DOCUMENTS

| | | |
|---|---|---|
| 3,810,874 A | 5/1974 | Mitsch et al. |
| 3,919,351 A | 11/1975 | Chang et al. |
| 4,251,277 A | 2/1981 | Martin |
| 4,271,258 A | 6/1981 | Watariguchi |
| 4,512,848 A | 4/1985 | Deckman et al. |
| 4,514,439 A | 4/1985 | Rounds |
| 4,517,337 A | 5/1985 | Lockhart et al. |
| 4,544,572 A | 10/1985 | Sandvig et al. |
| 4,552,833 A | 11/1985 | Ito et al. |
| 4,614,667 A | 9/1986 | Larson et al. |
| 4,617,238 A | 10/1986 | Crivello et al. |
| 4,687,707 A | 8/1987 | Matsuo et al. |
| 4,722,878 A | 2/1988 | Watakabe et al. |
| 4,731,155 A | 3/1988 | Napoli et al. |
| 4,808,511 A | 2/1989 | Holmes |
| 4,826,943 A | 5/1989 | Ito et al. |
| 4,931,351 A | 6/1990 | McColgin et al. |
| 4,959,252 A | 9/1990 | Bonnebat et al. |
| 4,988,274 A | 1/1991 | Kenmochi |
| 5,028,366 A | 7/1991 | Harakal et al. |
| 5,028,511 A | 7/1991 | Choi |
| 5,108,875 A | 4/1992 | Thackeray et al. |
| 5,149,592 A | 9/1992 | Wojnarowicz |
| 5,169,494 A | 12/1992 | Hashimoto et al. |
| 5,204,381 A | 4/1993 | Zeigler |
| 5,206,983 A | 5/1993 | Guckel et al. |
| 5,234,793 A | 8/1993 | Sebald et al. |
| 5,242,711 A | 9/1993 | DeNatale et al. |
| 5,259,926 A | 11/1993 | Kuwabara et al. |
| 5,298,556 A | 3/1994 | Stephens |
| 5,314,731 A | 5/1994 | Yoneda et al. |
| 5,318,870 A | 6/1994 | Hartney |
| 5,331,020 A | 7/1994 | Brown et al. |
| 5,369,722 A | 11/1994 | Heming et al. |
| 5,374,454 A | 12/1994 | Bickford et al. |
| 5,380,474 A | 1/1995 | Rye et al. |
| 5,389,696 A | 2/1995 | Dempsey et al. |
| 5,395,954 A | 3/1995 | Soria et al. |
| 5,417,802 A | 5/1995 | Obeng |
| 5,425,848 A | 6/1995 | Haisma et al. |
| 5,432,700 A | 7/1995 | Hrovat et al. |
| 5,439,766 A | 8/1995 | Day et al. |
| 5,458,953 A | 10/1995 | Wang |
| 5,459,198 A | 10/1995 | Sharp |
| 5,462,700 A | 10/1995 | Beeson et al. |

(Continued)

FOREIGN PATENT DOCUMENTS

EP    1342736 A2    9/2003

(Continued)

OTHER PUBLICATIONS

Feynman, There's Plenty of Room at the Bottom, Dec. 1, 1959.

(Continued)

*Primary Examiner*—Sanza L McClendon
(74) *Attorney, Agent, or Firm*—Heather L. Flanagan; Laura C. Robinson

(57) ABSTRACT

The present invention is directed to a composition of adhering together first and second materials. The composition features a multi-functional reactive compound that includes a backbone group and first and second functional groups; a cross-linker, and a catalyst. The first functional group is responsive to a first actinic energy to form cross-linked molecules and to adhere a subset of the cross-linked molecules to the first material. The second functional group is responsive to a second actinic energy, differing from the first actinic energy to adhere to the second material.

21 Claims, 4 Drawing Sheets

U.S. PATENT DOCUMENTS

| | | |
|---|---|---|
| 5,482,768 A | 1/1996 | Kawasato et al. |
| 5,512,131 A | 4/1996 | Kumar et al. |
| 5,523,878 A | 6/1996 | Wallace et al. |
| 5,527,662 A | 6/1996 | Hashimoto et al. |
| 5,542,978 A | 8/1996 | Kindt-Larsen et al. |
| 5,545,367 A | 8/1996 | Bae et al. |
| 5,578,683 A | 11/1996 | Koch et al. |
| 5,594,042 A | 1/1997 | Glover et al. |
| 5,601,641 A | 2/1997 | Stephens |
| 5,629,095 A | 5/1997 | Bujanowski et al. |
| 5,629,128 A | 5/1997 | Shirakawa et al. |
| 5,669,303 A | 9/1997 | Maracas et al. |
| 5,723,242 A | 3/1998 | Woo et al. |
| 5,725,788 A | 3/1998 | Maracas et al. |
| 5,772,905 A | 6/1998 | Chou |
| 5,776,748 A | 7/1998 | Singhvi et al. |
| 5,820,769 A | 10/1998 | Chou |
| 5,837,314 A | 11/1998 | Beaton et al. |
| 5,849,209 A | 12/1998 | Kindt-Larsen et al. |
| 5,849,222 A | 12/1998 | Jen et al. |
| 5,861,467 A | 1/1999 | Bujanowski et al. |
| 5,888,650 A | 3/1999 | Calhoun et al. |
| 5,895,263 A | 4/1999 | Carter et al. |
| 5,905,104 A | 5/1999 | Eklund et al. |
| 5,942,302 A * | 8/1999 | Ha et al. .......... 428/64.1 |
| 5,948,470 A | 9/1999 | Harrison et al. |
| 5,956,216 A | 9/1999 | Chou |
| 6,015,609 A | 1/2000 | Chaouk et al. |
| 6,060,530 A | 5/2000 | Chaouk et al. |
| 6,063,888 A | 5/2000 | Yamaguchi et al. |
| 6,066,269 A | 5/2000 | Wei et al. |
| 6,114,404 A | 9/2000 | Deeken et al. |
| 6,117,708 A | 9/2000 | Wensel |
| 6,132,632 A | 10/2000 | Haney et al. |
| 6,146,811 A | 11/2000 | Kim et al. |
| 6,160,030 A | 12/2000 | Chaouk et al. |
| 6,174,931 B1 | 1/2001 | Moon et al. |
| 6,174,932 B1 | 1/2001 | Pachl et al. |
| 6,190,929 B1 | 2/2001 | Wang et al. |
| 6,200,736 B1 | 3/2001 | Tan |
| 6,204,343 B1 | 3/2001 | Barucha et al. |
| 6,218,316 B1 | 4/2001 | Marsh |
| 6,225,367 B1 | 5/2001 | Chaouk et al. |
| 6,261,469 B1 | 7/2001 | Zakhidov et al. |
| 6,309,580 B1 | 10/2001 | Chou |
| 6,316,290 B1 | 11/2001 | Wensel |
| 6,334,960 B1 | 1/2002 | Willson et al. |
| 6,335,149 B1 | 1/2002 | Xu et al. |
| 6,342,097 B1 | 1/2002 | Terry et al. |
| 6,344,105 B1 | 2/2002 | Daugherty et al. |
| 6,355,198 B1 | 3/2002 | Kim et al. |
| 6,391,217 B2 | 5/2002 | Schaffer et al. |
| 6,399,406 B2 | 6/2002 | Chan et al. |
| 6,446,933 B1 | 9/2002 | Westmoreland |
| 6,447,919 B1 | 9/2002 | Brown et al. |
| 6,468,642 B1 | 10/2002 | Bray et al. |
| 6,468,896 B2 | 10/2002 | Rohr et al. |
| 6,475,704 B1 | 11/2002 | Iwasaki et al. |
| 6,482,742 B1 | 11/2002 | Chou |
| 6,495,624 B1 | 12/2002 | Brown |
| 6,497,961 B2 | 12/2002 | Kang et al. |
| 6,503,914 B1 | 1/2003 | Benish et al. |
| 6,517,995 B1 | 2/2003 | Jacobson et al. |
| 6,518,168 B1 | 2/2003 | Clem et al. |
| 6,518,189 B1 | 2/2003 | Chou |
| 6,541,356 B2 | 4/2003 | Fogel et al. |
| 6,544,594 B2 | 4/2003 | Linford et al. |
| 6,565,776 B1 | 5/2003 | Li et al. |
| 6,580,172 B2 | 6/2003 | Mancini et al. |
| 6,583,248 B1 | 6/2003 | Bowen |
| 6,600,207 B2 | 7/2003 | Huang et al. |
| 6,605,849 B1 | 8/2003 | Lutwak et al. |
| 6,607,173 B2 | 8/2003 | Westmoreland |
| 6,610,458 B2 | 8/2003 | Miller et al. |
| 6,646,662 B1 | 11/2003 | Nebashi et al. |
| 6,649,272 B2 | 11/2003 | Moore et al. |
| 6,664,026 B2 | 12/2003 | Nguyen et al. |
| 6,664,306 B2 | 12/2003 | Gaddam et al. |
| 6,667,082 B2 | 12/2003 | Bamore et al. |
| 6,696,157 B1 | 2/2004 | David et al. |
| 6,696,220 B2 | 2/2004 | Bailey et al. |
| 6,713,238 B1 | 3/2004 | Chou et al. |
| 6,719,915 B2 | 4/2004 | Willson et al. |
| 6,720,076 B2 | 4/2004 | McBain |
| 6,721,529 B2 | 4/2004 | Chen et al. |
| 6,737,489 B2 | 5/2004 | Linert et al. |
| 6,774,183 B1 | 8/2004 | Palumbo et al. |
| 6,776,094 B1 | 8/2004 | Whitesides et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,828,244 B2 | 12/2004 | Chou |
| 6,830,819 B2 | 12/2004 | Kaplan et al. |
| 6,849,558 B2 | 2/2005 | Schaper |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,932,934 B2 | 8/2005 | Choi et al. |
| 6,936,194 B2 | 8/2005 | Watts |
| 6,957,608 B1 | 10/2005 | Hubert |
| 7,011,932 B2 | 3/2006 | Ferm et al. |
| 7,037,639 B2 | 5/2006 | Voisin |
| 7,077,992 B2 | 7/2006 | Sreenivasan et al. |
| 7,122,482 B2 | 10/2006 | Xu et al. |
| 7,138,362 B2 | 11/2006 | Abe et al. |
| 7,141,188 B2 | 11/2006 | Li et al. |
| 7,157,036 B2 | 1/2007 | Choi et al. |
| 7,241,823 B2 * | 7/2007 | Kashiwagi et al. .......... 524/261 |
| 7,307,118 B2 | 12/2007 | Xu et al. |
| 7,309,225 B2 | 12/2007 | McMackin et al. |
| 7,338,275 B2 | 3/2008 | Choi et al. |
| 7,365,103 B2 | 4/2008 | Willson et al. |
| 2001/0044075 A1 | 11/2001 | Nishimura et al. |
| 2002/0042027 A1 | 4/2002 | Chou et al. |
| 2002/0072009 A1 | 6/2002 | Kim et al. |
| 2002/0094496 A1 | 7/2002 | Choi et al. |
| 2002/0123592 A1 * | 9/2002 | Zhang et al. ................ 528/10 |
| 2002/0132482 A1 | 9/2002 | Chou |
| 2002/0135099 A1 | 9/2002 | Robinson et al. |
| 2002/0146642 A1 | 10/2002 | Kim et al. |
| 2002/0167117 A1 | 11/2002 | Chou |
| 2002/0177319 A1 | 11/2002 | Chou |
| 2003/0034329 A1 | 2/2003 | Chou |
| 2003/0054115 A1 | 3/2003 | Albano et al. |
| 2003/0062334 A1 | 4/2003 | Lee et al. |
| 2003/0080471 A1 | 5/2003 | Chou |
| 2003/0080472 A1 | 5/2003 | Chou |
| 2003/0129542 A1 | 7/2003 | Shih et al. |
| 2003/0166814 A1 | 9/2003 | Sparrowe et al. |
| 2003/0235787 A1 | 12/2003 | Watts et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0046288 A1 | 3/2004 | Chou |
| 2004/0065252 A1 | 4/2004 | Sreenivasan et al. |
| 2004/0110856 A1 | 6/2004 | Young et al. |
| 2004/0112862 A1 | 6/2004 | Willson et al. |
| 2004/0116548 A1 | 6/2004 | Willson et al. |
| 2004/0118809 A1 | 6/2004 | Chou et al. |
| 2004/0124566 A1 | 7/2004 | Sreenivasan et al. |
| 2004/0127613 A1 * | 7/2004 | Kashiwagi et al. .......... 524/261 |
| 2004/0131718 A1 | 7/2004 | Chou et al. |
| 2004/0137734 A1 | 7/2004 | Chou et al. |
| 2004/0156108 A1 | 8/2004 | Chou et al. |

| | | | |
|---|---|---|---|
| 2004/0168613 | A1 | 9/2004 | Nguyen et al. |
| 2004/0170770 | A1 | 9/2004 | Nguyen et al. |
| 2004/0175631 | A1 | 9/2004 | Crocker et al. |
| 2004/0191429 | A1 | 9/2004 | Patrick |
| 2004/0192041 | A1 | 9/2004 | Jeong et al. |
| 2004/0197843 | A1 | 10/2004 | Chou et al. |
| 2004/0202865 | A1 | 10/2004 | Homola et al. |
| 2004/0202872 | A1 | 10/2004 | Fang et al. |
| 2004/0241338 | A1 | 12/2004 | Foster et al. |
| 2004/0250945 | A1 | 12/2004 | Zheng et al. |
| 2004/0256764 | A1 | 12/2004 | Choi et al. |
| 2005/0037143 | A1 | 2/2005 | Chou et al. |
| 2005/0051698 | A1 | 3/2005 | Sreenivasan et al. |
| 2005/0084804 | A1 | 4/2005 | Truskett et al. |
| 2005/0098534 | A1 | 5/2005 | Sreenivasan et al. |
| 2005/0100830 | A1 | 5/2005 | Xu et al. |
| 2005/0118749 | A1 | 6/2005 | Sakamoto et al. |
| 2005/0156357 | A1 | 7/2005 | Willson et al. |
| 2005/0160934 | A1 | 7/2005 | Xu et al. |
| 2005/0187339 | A1 | 8/2005 | Xu et al. |
| 2005/0224452 | A1 | 10/2005 | Spiess et al. |
| 2005/0236739 | A1 | 10/2005 | Willson et al. |
| 2006/0029811 | A1 | 2/2006 | Sugioka et al. |
| 2006/0030071 | A1 | 2/2006 | Mizukoshi et al. |
| 2006/0030653 | A1 | 2/2006 | Hu et al. |
| 2006/0035029 | A1 | 2/2006 | Xu et al. |
| 2006/0062867 | A1 | 3/2006 | Choi et al. |
| 2006/0062922 | A1 | 3/2006 | Xu et al. |
| 2006/0081557 | A1 | 4/2006 | Xu et al. |
| 2006/0108710 | A1 | 5/2006 | Xu et al. |
| 2006/0111454 | A1 | 5/2006 | Xu et al. |
| 2006/0708710 | | 5/2006 | Xu et al. |
| 2006/0145398 | A1 | 7/2006 | Bailey et al. |
| 2006/0175736 | A1 | 8/2006 | Xu et al. |
| 2006/0279024 | A1 | 12/2006 | Choi et al. |
| 2007/0017631 | A1 | 1/2007 | Xu |
| 2007/0021520 | A1 | 1/2007 | Xu |
| 2007/0042173 | A1 | 2/2007 | Nagaoka et al. |
| 2007/0059211 | A1 | 3/2007 | Edmiston |
| 2007/0141271 | A1 | 6/2007 | Xu et al. |
| 2007/0212494 | A1 | 9/2007 | Xu et al. |
| 2009/0155583 | A1 | 6/2009 | Xu et al. |

FOREIGN PATENT DOCUMENTS

| | | |
|---|---|---|
| EP | 1491356 A2 | 12/2004 |
| EP | 1533657 | 5/2005 |
| JP | 1-196749 | 8/1989 |
| JP | 02-92603 | 4/1990 |
| JP | 02192045 | 7/1990 |
| JP | 2-248480 | 10/1990 |
| JP | 02-248480 | 10/1990 |
| JP | 3-90345 | 4/1991 |
| JP | 61-40845 | 2/1996 |
| JP | 9-278490 | 10/1997 |
| WO | WO 87/02935 | 5/1987 |
| WO | WO 99/05724 | 2/1999 |
| WO | WO 00/21689 | 4/2000 |
| WO | WO 00/46035 | 8/2000 |
| WO | WO 01/47003 | 6/2001 |
| WO | WO 01/53889 | 7/2001 |
| WO | WO 02/069040 A1 | 9/2002 |
| WO | WO 03/073164 A2 | 9/2003 |
| WO | WO2007/050133 | 5/2007 |
| WO | WO2009/085090 | 7/2009 |

OTHER PUBLICATIONS

Hu et al., Fluorescence Probe Techniques (FPT) for Measuring the Relative Efficiencies of Free-Radical Photoinitiators, Macromolecules 1998, 31, pp. 4107-4113 May 29, 1998.
Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279 Jul. 1, 1999.
Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Kotachi et al., Si-Containing Positive Resist for ArF Excimer Laser Lithography, Photopolymer Science and Technology, pp. 615-622 Nov. 4, 1995.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Cowie, Polymers: Chemistry and Physics of Modern Materials, 2nd Ed. Jan. 1, 1991.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Chou et al., Imprint of Sub-25 nm Vias and Trenches in Polymers, Appl. Phys. Lett. 67 (21) Nov. 20, 1995.
Krug et al., Fine Patterning of Thin Sol-gel Films, Journal of Non-Crystalline Solids 147 & 148, pp. 447-450 Jan. 1, 1992.
Bender et al., Fabrication of Nanostructures using a UV-based Imprint Technique, Microelectronic Engineering 53, pp. 233-236 Jan. 1, 2000.
Nguyen, Asymmetric Fluid-Structure Dynamics in Nanoscale Imprint Lithography, The University of Texas at Austin, pp. 1-111 Aug. 1, 2001.
Eldada et al., Robust Photopolymers for MCM, Board, and Backplane Optical Interconnects, SPIE vol. 3288, pp. 175-191 Jan. 1, 1998.
Eldada et al., Affordable WDM Components: The Polymer Solution, SPIE vol. 3234, pp. 161-174 Jan. 1, 1998.
Eldada et al., Advanced Polymer Systems for Optoelectronic Integrated Circuit Applications, SPIE vol. 3006, pp. 344-361 Jan. 1, 1997.
Bender et al., Multiple Imprinting in UV-based Nanoimprint Lithography: Related Material Issues, Microelectronic Engineering 61-62, pp. 407-413 Jan. 1, 2002.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Hirai et al., Abstract of Mold Surface Treatment for Imprint Lithography, Journal of Photopolymer Science and Technology, pp. 457-462, vol. 14, No. 3 Aug. 1, 2001.
Hirai et al., Mold Surface Treatment for Imprint Lithography, Journal of Photopolymer Science and Technology, vol. 14, No. 3, pp. 457-462 Aug. 1, 2001.
Parikh et al., An Intrinsic Relationship between Molecular Structure in Self-Assembled n-Alkylsiloxane Monolayers and Deposition Temperature, Journal of Phys. Chem., pp. 7577-7590 Jul. 1, 1994.
Sagiv, Organized Monolayers by Absorption. 1. Formation and Structure of Oleophobic Mixed Monolayers on Solid Surfaces, Journal of the American Chemical Society/102:1 Jan. 2, 1980.

Roos et al., Nanoimprint Lithography with a Commercial 4 Inch Bond System for Hot embossing, Proceedings of SPIE vol. 4343, pp. 427-435 Oct. 1, 2001.

Roos et al., Abstract of Nanoimprint Lithography with a Commercial 4 Inch Bond System for Hot Embossing, Proceedings of SPIE vol. 4343, pp. 427-435 Oct. 1, 2001.

Sung et al., Abstract of Micro/nano-tribological Characteristics of Self-Assembled Monolayer and its Application in Nano-Structure Fabrication, Elsevier Science B.V., vol. 255, No. 7 Jul. 1, 2003.

Sung et al., Micro/nano-tribological Characteristics of Self-Assembled Monolayer and its Application in Nano-Structure Fabrication, Elsevier Science B.V., vol. 255, No. 7, pp. 808-818 Jul. 1, 2003.

Papirer et al., Abstract of the Grafting of Perfluorinated Silanes onto the Surface of Silica: Characterization by Inverse Gas Chromatography, Journal of Colloid and Interface Science 159, pp. 238-242 Aug. 1, 1993.

Papirer et al., The Grafting of Perfluorinated Silanes onto the Surface of Silica: Characterization by Inverse Gas Chromatography, Journal of Colloid and Interface Science 159, pp. 238-242 Aug. 1, 1993.

Srinivasan et al., Alkyltrichlorosilane-Based Self-Assembled Monolayer Films for Stiction Reduction in Silicon Micromachines, Journal of Microelectromechanical Systems, vol. 7, No. 2, p. 252-260 Jun. 1, 1998.

Kim et al., Surface Energy and Polarity of Treated Indium-Tin-Oxide Anodes for Polymer Light-Emitting Diodes Studied by Contact-Angle Measurements, Journal of Applied Physics, vol. 86, No. 5, pp. 2774-2778 Aug. 4, 2004.

Chou et al., Ultrafast and Direct Imprint of Nanostructures in Silicon, Nature, col. 417, (Jun. 2002), pp. 835-837 Jun. 1, 2002.

U.S. Appl. No. 10/784,911, naming Inventors Xu et al., entitled Materials for Imprint Lithography, filed Feb. 23, 2004.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Sol-Gel Technology, www.chemat.com/html/solgel.html Jan. 14, 2004.

Sol-Gel Chemistry, www.prsc.usm.edu/mauritz/solgel.html Feb. 2, 2004.

Hakovirta et al., Optical Properties of Fluorinated Diamond-Like Carbon Films Produced by Pulsed Glow Discharge Plasma Immersion Ion Processing, Journal of Applied Physics 88(3); pp. 1456-1459 Aug. 1, 2000.

Yu et al., Properties of Fluorinated Amorphous Diamond Like Carbon Films by PECVD, Applied Surface Science 219 (3-4); pp. 228-237 Dec. 1, 2003.

Compon et al., Electroanalysis at Diamond-Like and Doped-Diamond Electrodes, Electroanalysis 15(17); pp. 1349-1363 Sep. 1, 2003.

Mansano et al., Protective Carbon Layer for Chemical Corrosion of Stainless Steel, Diamond and Related Materials 12 (3-7); pp. 749-752 Mar. 1, 2003.

Butter et al., Production and Wetting Properties of Fluorinated Diamond-Like Carbon Coatings, Thin Solid Films, 311(1-2); pp. 107-113 Dec. 31, 1997.

Hakovirta et al., Heat Resistance of Fluorinated Diamond-Like Carbon Films, Diamond and Related Materiasl 10(8); pp. 1486-1490 Aug. 1, 2001.

Zhu et al., The Improvement of the Oxidation Resistance of TiAl Alloys by Fluorine Plasma-Based Ion Implantation, Surface and Coatings Technology 158; pp. 502-507 Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178 Apr. 17, 2004.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

U.S. Appl. No. 11/027,473, naming Inventors Bailey et al., entitled Release Layer Comprising Diamond-Like Carbon (DLC) or Doped DLC with Tunable Composition for Imprint Lithography Templates and Contact Masks, filed Dec. 30, 2004.

U.S. Appl. No. 10/789,319, naming Inventors Xu et al., entitled Composition for an Etching Mask Comprising a Silicon-Containing Material, filed Feb. 27, 2004.

U.S. Appl. No. 10/948,511, naming Inventors Xu et al., entitled Polymerization Technique to Attenuate Oxygen Inhibition of Solidification of Liquids and Composition Thereof, filed Sep. 23, 2004.

U.S. Appl. No. 10/967,740, naming Inventors Xu et al., entitled Low-K Dielectric Functional Imprinting Materials, filed Oct. 18, 2004.

U.S. Appl. No. 10/919,062, naming Inventors Xu et al., entitled Composition to Provide a Lyaer with Uniform Etch Characteristics, filed Aug. 16, 2004.

U.S. Appl. No. 10/919,224, naming Inventors Xu et al., entitled Method to Provide a Layer with Uniform Etch Characteristics, filed Aug. 16, 2004.

U.S. Appl. No. 10/978,285, naming Inventors Wilson et al., entitled Step and Flash Imprint Lithography, filed Oct. 29, 2004.

U.S. Appl. No. 11/062,420, naming Inventors Willson et al., entitled Step and Flash Imprint Lithography, filed Feb. 22, 2005.

U.S. Appl. No. 11/068,397, naming Inventors Xu et al., entitled Method of Providing Desirable Wetting and Release Characteristics between a Mold and a Polyerizable Composition, filed Feb. 28, 2005.

U.S. Appl. No. 11/068,174, naming Inventors Xu et al., entitled Method to Reduce Adhesion Between a Conformable Region and a Mold, filed Feb. 28, 2005.

Schneider et al., Stripes of Partially Fluorinated Alkyl Chains: Dipolar Langmuir Monolayers, J. Chem. Phys. Vol. 122, Issue 9 Mar. 1, 2005.

U.S. Appl. No. 11/068,171, naming Inventors Xu et al., entitled Composition to Reduce Adhesion Between a Conformable Region and a Mold, filed Feb. 28, 2005.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lectures/lecture_2/materials/materials.html Mar. 31, 2005.

Data Sheet for Cymel 303ULF, www.cytec.com.

Data Sheet for Cycat 4040, www.cytec.com.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition.

Data Sheet for Dow Coming Z-6018,.

Data Sheet for Methyl Amyl Ketone, www.arb.ca.gov/db/solvents/solvent_pages/Ketones-HTML/methyl_amyl.htm Mar. 31, 2005.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquioxane: I. Structure and Bonding, Journal of the Electrochemical Society, 149 (12) F161-F170 Oct. 16, 2002.

Wolf et al., Silicion Processing for the VLSI Era, vol. 1—Process Technology, pp. 407-413 Jan. 1, 1986.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

Wolf et al., Silicon Processing for the VLSI Era, vol. 1—Process Technology, pp. 541, 542, 544, 564, 565 Jan. 1, 1986.

Novec Fluorosurfactant FC-4432, http://multimedia.mmm.com/mws/mediawebserver.dyn?333333SQa783cMj3wMj333wyXuFiiiiH-Aug. 4, 2005.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

U.S. Appl. No. 11/187,407, naming Inventors Xu, entitled Method for adhering materials together, filed Jul. 22, 2005.

Xu et al., Development of Imprint Materials for the Step and Flash Imprint Lithography Process, SPIE Microlithography Conference Feb. 1, 2004.

Nordquist et al., Image Placement Issues for ITO-based Step and Flash Imprint Lithography Templates, J. Vac. Sci. Technol. B, pp. 695-701 Mar. 1, 2004.

Resnick et al., Release Layers for Contact and Imprint Lithography, Semiconductor International, pp. 71-80 Jun. 1, 2002.

Novec Fluorosurfacants for Paints and Coatings, Nov. 3, 2003.

Translation of Japanese Patent 61-40845, Feb. 1, 1986.

Translation of Japanese Patent 02-248480, Oct. 1, 1990.

Translation of Japanese Patent 03-090345, Apr. 1, 1991.

Translation of Japanese Patent 09-278490, Oct. 1, 1997.

Abstract of Japanese Patent 03-090345, Apr. 1, 1991.

Abstract of Japanese Patent 09-278490, Oct. 1, 1997.

Colburn et al., Dissertation for the Degree of Doctor of Philosophy, Step and Flash Imprint Lithography: A Low-Pressure, Room-Temperature Nanoimprint Lithography Aug. 1, 2001.

FC-4432 Produce Brochure, 3M Fluorosurfactant Mar. 1, 2002.

U.S. Appl. No. 11/560,266, naming Inventors Xu, entitled Methods and Compositions for Providing Preferential Adhesion and Release of Adjacent Surfaces, filed Nov. 15, 2006.

U.S. Appl. No. 11/734,542, naming Inventors Xu et al., entitled Method for Imprint Lithography Utilizing an Adhesion Primer Layer, filed Apr. 12, 2007.

U.S. Appl. No. 11/837,757, naming Inventors Xu et al., entitled Composition to Reduce Adhesion between a Conformable Region and a Mol, filed Aug. 13, 2007.

PCT/US2008/057518 ISR, Jun. 25, 2008.

Huang et al., Reversal Imprinting by Transferring Polymer from Mold to Substrate, J. Vac. Sc. Technol. B 20(6); pp. 2872-2876 Nov. 1, 2002.

DuPont Zonyl Fluorochemical Intermediates, www.dupont.com/zonyl/pdf/intermediates.pdf; pp, 1-16 Jun. 21, 2003.

DuPont Zonyl UR, www.dupont.com/zonyl/pdf/UR.pdf; pp. 1-2 Jun. 21, 2003.

DuPont Zonyl FSN, www.dupont.com/zonyl/odf/FSN.pdf, pp. 1-2 Aug. 24, 2003.

Masurt FS-230, www.masonsurfactants.com/Products/Masurf_FS_230,htm; pp. 1-2 Apr. 5, 2004.

Morita et al., Three-Dimensional Nanoimprint Fabrication by Focused-Ion-Beam Chemical Vapor Deposition, Jpn. J. Appl. Phys., vol. 42, Pt. 1, No. 6B, pp. 3874-3876 Jan. 1, 2003.

Dorfman et al., Diamond-like nanocomposites (DLN), Thin Solid Films, vol. 212; pp. 267-273 May 15, 1992.

Peeters et al, O-NMR of Sol-Gel Processes of TEOS and TMOS, Journal of Sol-Gel Science and Technology 13, 71-74 Jan. 1, 1998.

PCT, International Search Report for Publication No. WO/2009/085090, dated Jun. 1, 2009, 1 page.

PCT, International Search Report for Publication No. for WO2007/050133, dated Sep. 13, 2007, 1 page.

Peeters et al., "$^{17}$O-NMR of Sol-Gel Processes of TEOS and TMOS," Journal of Sol-Gel Science and Technology 13 (1998) 71-74.

Yoneda et al., Translation of Japanese Patent 02-248480, Transparent Substrate with Water-Repellent and Antistaining Properties, and Structure Equipped Therewith Oct. 4, 1990.

Yoneda et al., Translation of Japanese Patent 02-248480, Transparent Substrate Material with Water-Repllent and Anti-Staining Properties and Structure Equipped with Same Oct. 4, 1990.

* cited by examiner

COMPOSITION FOR ADHERING MATERIALS TOGETHER

CROSS-REFERENCE TO RELATED APPLICATIONS

The present application is a divisional of U.S. patent application Ser. No. 11/187,407, filed Jul. 22, 2005, entitled "Method for Adhering Materials Together," listing Frank Y. Xu as inventor, which is incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND OF THE INVENTION

The field of invention relates generally to nano-fabrication of structures. More particularly, the present invention is directed to a method for adhering differing materials together suitable for use in imprint lithographic processes.

Nano-scale fabrication involves the fabrication of very small structures, e.g., having features on the order of one nanometer or more. A promising process for use in nano-scale fabrication is known as imprint lithography. Exemplary imprint lithography processes are described in detail in numerous publications, such as United States published patent application 2004-0065976 filed as U.S. patent application Ser. No. 10/264,960, entitled "Method and a Mold to Arrange Features on a Substrate to Replicate Features having Minimal Dimensional Variability"; United States published patent application 2004-0065252 filed as U.S. patent application Ser. No. 10/264,926, entitled "Method of Forming a Layer on a Substrate to Facilitate Fabrication of Metrology Standards"; and United States published patent application 2004-0046271 filed as U.S. patent application Ser. No. 10/235,314 (U.S. Pat. No. 6,936,194), entitled "Method and a Mold to Arrange Features on a Substrate to Replicate Features having Minimal Dimensions Variability"; all of which are assigned to the assignee of the present invention.

Referring to FIG. 1, the basic concept behind imprint lithography is forming a relief pattern on a substrate that may function as, inter alia, an etching mask so that a pattern may be formed into the substrate that corresponds to the relief pattern. A system 10 employed to form the relief pattern includes a stage 11 upon which a substrate 12 is supported, and a template 14 having a mold 16 with a patterning surface 18 thereon. Patterning surface 18 may be substantially smooth and/or planar, or may be patterned so that one or more recesses are formed therein. Template 14 is coupled to an imprint head 20 to facilitate movement of template 14. A fluid dispense system 22 is coupled to be selectively placed in fluid communication with substrate 12 so as to deposit polymerizable material 24 thereon. A source 26 of energy 28 is coupled to direct energy 28 along a path 30. Imprint head 20 and stage 11 are configured to arrange mold 16 and substrate 12, respectively, to be in superimposition, and disposed in path 30. Either imprint head 20, stage 11, or both vary a distance between mold 16 and substrate 12 to define a desired volume therebetween that is filled by polymerizable material 24.

Typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, which causes polymerizable material 24 to solidify and/or cross-link, forming polymeric material conforming to the shape of the substrate surface 25 and mold surface 18. Control of this process is regulated by processor 32 that is in data communication with stage 11, imprint head 20, fluid dispense system 22, and source 26, operating on a computer-readable program stored in memory 34.

An important characteristic with accurately forming the pattern in the polymerizable material is to reduce, if not prevent, adhesion to the mold of the polymeric material, while ensuring suitable adhesion to the substrate. This is referred to as preferential release and adhesion properties. In this manner, the pattern recorded in the polymeric material is not distorted during separation of the mold. Prior art attempts to improve the release characteristics employ a release layer on the surface of the mold. The release layer is typically hydrophobic and/or has low surface energy. The release layer adheres to the mold. Providing the release layer improves release characteristics. This is seen by minimization of distortions in the pattern recorded into the polymeric material that are attributable to mold separation. This type of release layer is referred to, for purposes of the present discussion, as an a priori release layer, i.e., a release layer that is solidified to the mold.

Another prior art attempt to improve release properties is described by Bender et al. in "Multiple Imprinting in UV-based Nanoimprint Lithography: Related Material Issues," Microeletronic Engineering 61-62 (2002), pp. 407-413. Specifically, Bender et al. employ a mold having an a priori release layer in conjunction with a fluorine-treated UV curable material. To that end, a UV curable layer is applied to a substrate by spin-coating a 200 cPs UV curable fluid to form a UV curable layer. The UV curable layer is enriched with fluorine groups to improve the release properties.

A need exists, therefore, to improve the preferential release and adhesion properties of a mold employed in imprint lithography processes.

SUMMARY OF THE INVENTION

The present invention is directed to a composition of adhering together first and second materials. The composition features a multi-functional reactive compound that includes a backbone group and first and second functional groups; a cross-linker, and a catalyst. The first functional group is responsive to a first actinic energy to form cross-linked molecules and to adhere a subset of the cross-linked molecules to the first material. The second functional group is responsive to a second actinic energy, differing from the first actinic energy to adhere to the second material. These and other embodiments are described herein.

DETAILED DESCRIPTION OF THE INVENTION

Figure 1:
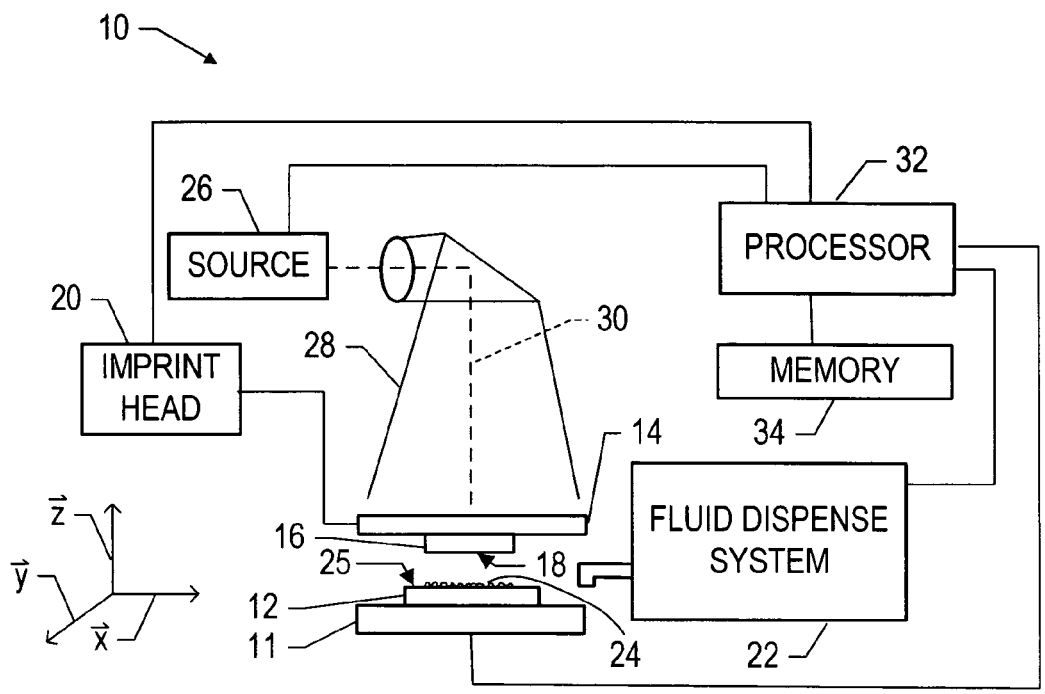
FIG. 1 is a simplified plan view of a lithographic system in accordance with the prior art.
Figure 2:
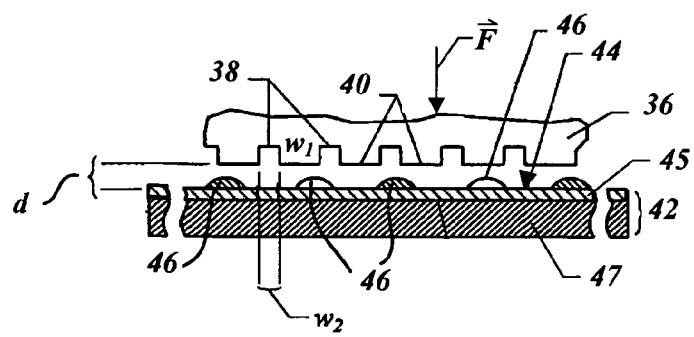
FIG. 2 is a simplified elevation view of a template and imprinting material disposed on a substrate in accordance with the present invention.

Referring to FIGS. 1 and 2, a mold 36, in accordance with the present invention, may be employed in system 10, and may define a surface having a substantially smooth or planar profile (not shown). Alternatively, mold 36 may include features defined by a plurality of spaced-apart recessions 38 and protrusions 40. The plurality of features defines an original pattern that forms the basis of a pattern to be formed on a substrate 42. Substrate 42 may comprise a bare wafer or a wafer with one or more layers disposed thereon, one of which is shown as primer layer 45. To that end, reduced is a distance "d" between mold 36 and substrate 42. In this manner, the features on mold 36 may be imprinted into a conformable region of substrate 42, such as an imprinting material disposed on a portion of surface 44 that presents a substantially planar profile. It should be understood that the imprinting material may be deposited using any known technique, e.g., spin-coating, dip coating and the like. In the present example, however, the imprinting material is deposited as a plurality of spaced-apart discrete droplets 46 on substrate 42. Imprinting material is formed from a composition that may be selectively polymerized and cross-linked to record the original pattern therein, defining a recorded pattern.

Specifically, the pattern recorded in the imprinting material is produced, in part, by interaction with mold 36, e.g., electrical interaction, magnetic interaction, thermal interaction, mechanical interaction or the like. In the present example, mold 36 comes into mechanical contact with the imprinting material, spreading droplets 36, so as to generate a contiguous formation 50 of the imprinting material over surface 44. In one embodiment, distance "d" is reduced to allow sub-portions 52 of imprinting material to ingress into and fill recessions 38. To facilitate filling of recessions 38, before contact between mold 36 and droplets 46, the atmosphere between mold 36 and droplets 46 is saturated with helium or is completely evacuated or is a partially evacuated atmosphere of helium.

The imprinting material is provided with the requisite properties to completely fill recessions 38 while covering surface 44 with a contiguous formation of the imprinting material. In the present embodiment, sub-portions 54 of imprinting material in superimposition with protrusions 40 remain after the desired, usually minimum, distance "d" has been reached. This action provides formation 50 with sub-portions 52 having a thickness $t_1$, and sub-portions 54, having a thickness $t_2$. Thicknesses "$t_1$" and "$t_2$" may be any thickness desired, dependent upon the application. Thereafter, formation 50 is solidified by exposing the same to the appropriate curing agent, e.g., actinic energy, such as broadband ultraviolet energy, thermal energy or the like, depending upon the imprinting material. This causes the imprinting material to polymerize and cross-link. The entire process may occur at ambient temperatures and pressures, or in an environmentally-controlled chamber with desired temperatures and pressures. In this manner, formation 50 is solidified to provide side 56 thereof with a shape conforming to a shape of a surface 58 of mold 36.

Figure 3:
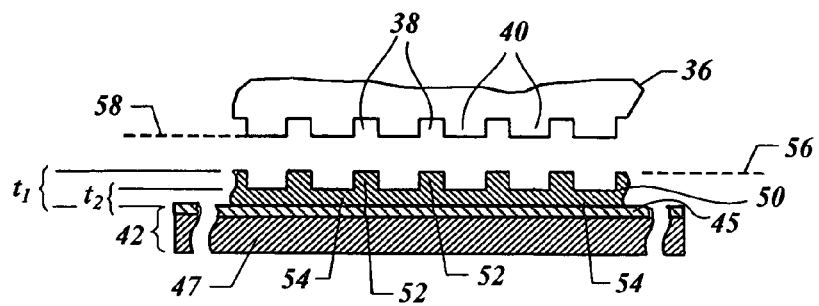
FIG. 3 is a simplified elevation view of the template and substrate, shown in FIG. 2, with the imprinting material being shown as patterned and solidified upon the layer.

Referring to FIGS. 1, 2 and 3, the characteristics of the imprinting material are important to efficiently pattern substrate 42 in light of the unique patterning process employed. For example, it is desired that the imprinting material have certain characteristics to facilitate rapid and even filling of the features of mold 36 so that all thicknesses $t_1$ are substantially uniform and all thicknesses $t_2$ are substantially uniform. To that end, it is desirable that the viscosity of the imprinting material be established, based upon the deposition process employed, to achieve the aforementioned characteristics. As mentioned above, the imprinting material may be deposited on substrate 42 employing various techniques. Were the imprinting material deposited as a plurality of discrete and spaced-apart droplets 46, it would be desirable that a composition from which the imprinting material is formed have relatively low viscosity, e.g., in a range of 0.5 to 20 centipoises (cPs). Considering that the imprinting material is spread and patterned concurrently, with the pattern being subsequently solidified into formation 50 by exposure to radiation, it would be desired to have the composition wet surface of substrate 42 and/or mold 36 and to avoid subsequent pit or hole formation after polymerization. Were the imprinting material deposited employing spin-coating techniques, it would be desired to use higher viscosity materials, e.g., having a viscosity greater than 10 cPs and typically, several hundred to several thousand cPs, with the viscosity measurement being determined in the absence of a solvent.

In addition to the aforementioned characteristics, referred to as liquid phase characteristics, it is desirable that the composition provide the imprinting material with certain solidified phase characteristics. For example, after solidification of formation 50, it is desirable that preferential adhesion and release characteristics be demonstrated by the imprinting material. Specifically, it is beneficial for the composition from which the imprinting material is to be fabricated to provide formation 50 with preferential adhesion to substrate 42 and preferential release of mold 36. In this fashion, reduced is the probability of distortions in the recorded pattern resulting from the separation of mold 36 therefrom due to, inter alia, tearing, stretching or other structural degradation of formation 50.

The constituent components of the composition that form the imprinting material to provide the aforementioned characteristics may differ. This results from substrate 42 being formed from a number of different materials. As a result, the chemical composition of surface 44 varies dependent upon the material from which substrate 42 is formed. For example, substrate 42 may be formed from silicon, plastics, gallium arsenide, mercury telluride, and composites thereof. As mentioned above, substrate 42 may include one or more layers shown as primer layer 45, e.g., dielectric layer, metal layer, semiconductor layer, planarization layer and the like, upon which formation 50 is generated. To that end, primer layer 45 would be deposited upon a wafer 47 employing any suitable technique, such as chemical vapor deposition, spin-coating and the like. Additionally, primer layer 45 may be formed from any suitable material, such as silicon, germanium and the like. Additionally, mold 36 may be formed from several materials, e.g., fused-silica, quartz, indium tin oxide, diamond-like carbon, MoSi, sol-gels and the like.

It has been found that the composition from which formation 50 is generated may be fabricated from several different families of bulk materials. For example, the composition may be fabricated from vinyl ethers, methacrylates, epoxies, thiolenes and acrylates, just to name a few.

An exemplary bulk material from which to form formation 50 is as follows:

BULK IMPRINTING MATERIAL isobornyl acrylate n-hexyl acrylate ethylene glycol diacrylate 2-hydroxy-2-methyl-1-phenyl-propan-1-one The acrylate component, isobornyl acrylate (IBOA), has the following structure:

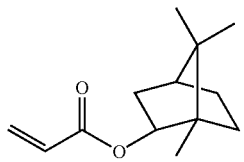

and comprises approximately 47% of bulk material by weight, but may be present in a range of 20% to 80%, inclusive. As a result, the mechanical properties of formation 50 are primarily attributable to IBOA. An exemplary source for IBOA is Sartomer Company, Inc. of Exton, Pa. available under the product name SR 506.

The component n-hexyl acrylate (n-HA) has the following structure:

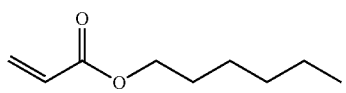

and comprises approximately 25% of bulk material by weight, but may be present in a range of 0% to 50%, inclusive. Also providing flexibility to formation 50, n-HA is employed to reduce the viscosity of the prior art bulk material so that bulk material, in the liquid phase, has a viscosity in a range 2-9 Centipoises, inclusive. An exemplary source for the n-HA component is the Aldrich Chemical Company of Milwaukee, Wis.

A cross-linking component, ethylene glycol diacrylate, has the following structure:

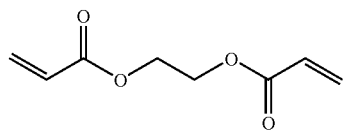

and comprises approximately 25% of bulk material by weight, and may be present in a range of 10% to 50%, inclusive. EGDA also contributes to the modulus and stiffness buildup, as well as facilitates cross-linking of n-HA and IBOA during polymerization of the bulk material.

An initiator component, 2-hydroxy-2-methyl-1-phenyl-propan-1-one is available from Ciba Specialty Chemicals of Tarrytown, N.Y. under the trade name DAROCUR® 1173, and has the following structure:

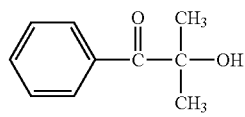

and comprises approximately 3% of the bulk material by weight, and may be present in a range of 1% to 5%, inclusive. The actinic energy to which the initiator is responsive is broadband ultraviolet energy generated by a medium-pressure mercury lamp. In this manner, the initiator facilitates cross-linking and polymerization of the components of the bulk material.

It has been disclosed, however, in co-pending U.S. patent application Ser. No. 11/068,171, filed Feb. 28, 2005, entitled "Composition to Reduce Adhesion Between a Conformable Region and a Mold," having Frank Xu and Michael N. Miller listed as inventors, that desirable preferential adhesion and release properties, as discussed above, may be achieved by producing a weak boundary layer, lamella 60, between mold 36, surface 58 and formation 50, shown in FIGS. 3 and 4. Lamella 60 remains after solidification of the imprinting material. As a result, the adhesion forced between mold 36 and formation 50 are minimal. To that end, found beneficial was employing a composition for the imprinting material that includes one of several compositions, such as the BULK IMPRINTING MATERIAL discussed above, along with a component that contains low surface energy groups, referred to as a surfactant component and fully described in U.S. patent application Ser. No. 11/068,171, filed Feb. 28, 2005, entitled "Composition to Reduce Adhesion Between a Conformable Region and a Mold," having Frank Xu and Michael N. Miller listed as inventors, which is incorporated by reference herein.

Figure 5:
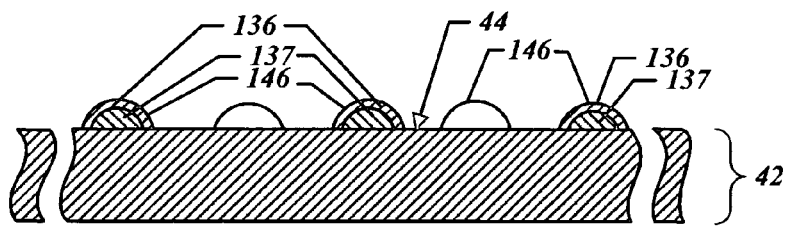
FIG. 5 is a detailed view of the droplets of imprint material, shown in FIG. 2, showing the bifurcation of the droplets into surfactant-rich regions and surfactant-depleted regions.

Referring to FIG. 5, after deposition of the imprinting material, the surfactant component rises, after a period of time, to the air liquid interface, providing droplets 146 of imprinting material with a bifurcated concentration of materials. In a first portion, droplets 146 include a higher concentration of the surfactant component, referred to as a surfactant-component-rich (SCR) sub-portion 136, than the second portion, referred to as a surfactant-component-depleted (SCD) sub-portion 137. SCD sub-portion 137 is positioned between surface 44 and SCR sub-portion 136. SCR sub-portion 136 attenuates the adhesion forces between mold 36 and the imprinting material, once the imprinting material is solidified. Specifically, the surfactant component has opposed ends. When the imprinting material is in the liquid phase, i.e., polymerizable, one of the opposed ends has an affinity for the bulk material included in the imprinting material. The remaining end has a fluorine component.

Figure 4:
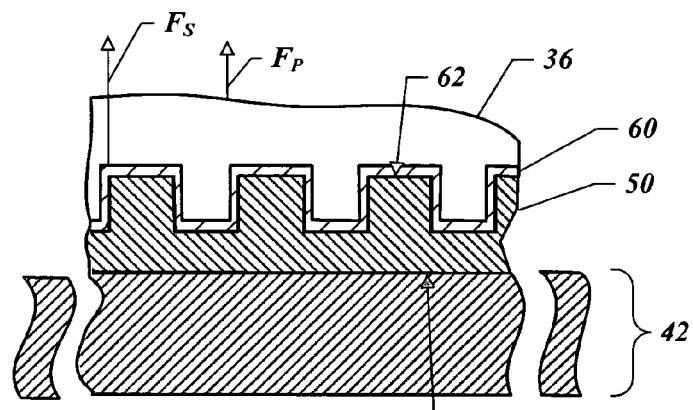
FIG. 4 is a cross-sectional view of the template contacting imprinting material demonstrating the formation of the weak boundary lamella between solidified imprinting material and a template.

Referring to FIGS. 4 and 5, as a result of the affinity for the bulk material, the surfactant component is orientated so that the fluorine component extends from an air-liquid interface defined by the imprinting material and the surrounding ambient.

Upon solidification of the imprinting material, a first portion of the imprinting material generates a lamella 60 and a second portion of the imprinting material is solidified, i.e., polymeric material shown as formation 50. Lamella 60 is positioned between formation 50 and mold 36. Lamella 60 results from the presence and location of the fluorine components in the SCR sub-portion 136. Lamella 60 prevents strong adhesion forces from being developed between mold 36 and formation 50. Specifically, formation 50 has first and second opposed sides 62 and 64. Side 62 adheres to mold 36 with a first adhesion force. Side 64 adheres to substrate 42 with a second adhesion force. Lamella 60 results in the first adhesion force being less than the second adhesion force. As a result, mold 36 may be easily removed from formation 50 while minimizing distortions and/or the force required to separate mold 36 therefrom. Although formation 50 is shown with side 62 being patterned, it should be understood that side 62 may be smooth, if not planar.

Figure 6:
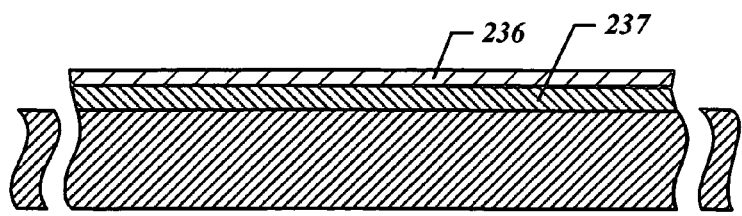
FIG. 6 is a detailed view of a layer of imprinting material, deposited employing spin-on techniques, showing the bifurcation of the layer into surfactant-rich regions and surfactant-depleted regions.

Furthermore, if desired, it is possible to generate lamella 60 so as to be disposed between formation 50 and substrate 42. This may be achieved, for example, by applying imprinting material to mold 36 and subsequently contacting substrate 42 with the imprinting material on mold 36. In this manner, it can be said that formation 50 will be disposed between lamella 60 and the body, e.g., mold 36 or substrate 42, upon which the polymerizable material is deposited. It should be understood that were the imprinting material deposited employing spin-coating techniques, similar bifurcated concentration of materials would occur, as shown in FIG. 6 with respect to SCR sub-portion 236 and second and SCD sub-portion 237. The time required for the bifurcation is dependent upon several factors, including the size of molecules in the composition and the viscosity of the composition. Only a few seconds is needed to achieve the aforementioned bifurcation of composition with viscosity below twenty cPs. Material with viscosity in the hundreds of cPs, however, may require a few seconds to several minutes.

It has been discovered, however, that lamella 60 may not be uniform. Some regions of lamella 60 are thinner than others, and in some extreme cases, lamella 60 may be absent in an extremely small percentage of the template surface so that template 36 is in contact with formation 50. As a result of the thinner regions of lamella 60 and in the absence of lamella 60, distortion and/or delamination of formation 50 from substrate 42 may occur. Specifically, upon separation of mold 36, formation 50 is subjected to a separation force $F_S$. Separation force $F_S$ is attributable to a pulling force $F_P$ on mold 36 and adhering forces, e.g., Van der Waals forces, between formation 50 and mold 36 as reduced by lamella 60. Due to the presence of lamella 60 separation force $F_S$ typically has a magnitude that is less than the magnitude of an adhering force $F_A$ between formation 50 and substrate 42. However, with the reduction, or absence, of lamella 60, local separation force $F_S$ may approach the magnitude of local adhering force $F_A$. By local forces what is meant are the forces present in a given region of lamella layer 60, which in this example are the local forces proximate to a thin region of lamella layer 60 or where lamella layer 60 is substantially absent. This leads to distortion and/or delamination of formation 50 from substrate 42.

Figure 7:
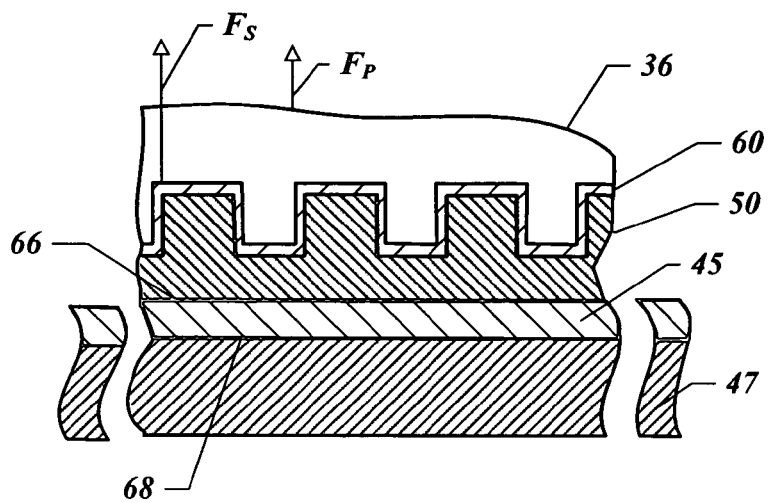
FIG. 7 is a cross-sectional view of the template contacting solidified imprinting material, deposited as shown in either FIG. 5 or 6, formed on a substrate including a primer layer.

Referring to FIG. 7, in the presence of primer layer 45, a more complex situation exists due to the presence of two interfaces 66 and 68. At a first interface 66 a first adhering force $F_1$ is present between primer layer 45 and formation 50. At a second interface 68 a second adhering force, $F_2$, is present between primer layer 45 and wafer 47. It is desired that the separation force $F_S$ have a magnitude that is less than either adhering forces $F_1$ and $F_2$. However, due to variations in the thickness, or absence, of lamella 60, as discussed above, separation force $F_S$ may be similar or approach the magnitude of one or both of adhering forces $F_1$ and $F_2$. This may cause delamination of formation 50 from primer layer 45, primer layer 45 from wafer 47 or both.

The present invention reduces, if not avoids, the delamination problem mentioned above by forming primer layer 45 from a material that increases the probability that first $F_1$ and second $F_2$ adhering forces of the first and second interface, respectively, are greater than the separation force $F_S$ in view of lamella layer fluctuations. To that end, primer layer 45 is formed from a composition that forms strong bonds at interface 66, i.e., between primer layer 45 and formation 50, as well as, i.e., between interface 66, primer layer 45 and wafer 47. In the present example, adhesion between primer layer 45 and formation 50 at first interface 66 is the result of covalent bonding, i.e., covalent bonds between the composition from which primer layer 45 is formed and the composition from which formation 50 is formed are present. Adhesion between primer layer 45 and wafer 47 may be achieved through any one of various mechanisms. These mechanisms may include covalent bonds formed between the composition from which primer layer 45 is formed and the material from which wafer 47 is formed. Alternatively, or in addition to, the covalent bonds, ionic bonds may be formed between the composition from which primer layer 45 is formed and the material from which wafer 47 is formed. Alternatively, or in addition to, the covalent bonds, and/or the ionic bonds or both, adhesion between the composition from which primer layer 45 is formed and the material from which wafer 47 is formed may be achieved vis-à-vis Van der Waals forces.

This is achieved by forming primer layer 45 from a composition that includes a multi-functional reactive compound, i.e., a compound that contained two or more functional groups generally represented as follows:

(1)

(2)

In which R, R', R" and R'" are linking groups and x, y, z are averaged repeating numbers of the groups associated therewith. These repeating units could be randomly distributed. The groups X and X' denote the functional groups, with the understanding that typically, the functional group X differs from functional group X'. One of the functional groups X and X', for example X', is selected to achieve cross-reaction with the material from which substrate 42 is formed to adhere thereto by forming a covalent bond therewith, ionic bond therewith and/or Van der Waals forces.

One of the remaining functional groups X and X', for example X, is selected to achieve cross-reaction with the material from which formation 50 is formed to form a covalent bond therebetween. The functionality of the X group is established so the cross-reaction occurs during polymerization of formation 50. As a result, the selection of functional group X depends upon the characteristics of the material from which formation 50 is formed. It is desired that functional group X react with the functional groups of the composition from which formation 50 is formed. For example, were formation 50 formed from acrylate monomers, X might be comprised of acrylic, vinyl ether, and or alkoxyl functional groups, and/or functional groups that could copolymerize with acrylic groups in formation 50. As a result, X functional groups cross-react in response to ultraviolet actinic energy.

Functional groups X' may also participate in the cross-linking and polymerization reactions of primer layer 45. Typically, X' functional groups facilitate polymerization and cross-linking in response to an actinic energy that differs from the actinic energy in response to which X functional groups cross-react. The X' functional groups in the present example facilitate cross-linking of molecules in primer layer 45 in response to exposure to thermal energy. Typically, functional groups X' are selected to facilitate cross-reaction with substrate 42 through three mechanisms: 1) direct reaction with material from which substrate 42 is formed; 2) reaction with cross-linker molecules with a linking functional group of the cross-linker reacting with substrate 42; and 3) polymerization of and cross-linking of primer layer 45 so that chains of molecules of sufficient length may be developed to connect between formation 50 and substrate 42.

Figure 8:
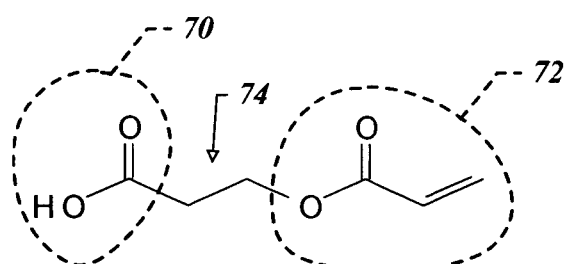
FIG. 8 is a plan view showing the chemical structure of a component of a composition that may be employed to form the primer layer shown in FIGS. 2, 3, and 7, in accordance with one embodiment of the present invention.

Referring to FIGS. 7 and 8, an exemplary multi-functional reactive compound that may be employed to form primer layer 45 in the presence of formation 50 being formed from BULK MATERIAL includes a β-carboxyethyl acrylate, available from UCB Chemicals in Smyrna, Ga. under the product name β-CEA. β-CEA is an aliphatic compound having the following structure:

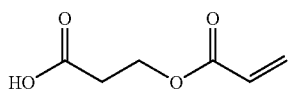

The X' functional group 70 provides carboxylic functionality. The X functional group 72 provides acrylate functionality. Functional groups 70 and 72 are coupled to opposing ends of a backbone component 74.

Figure 9:
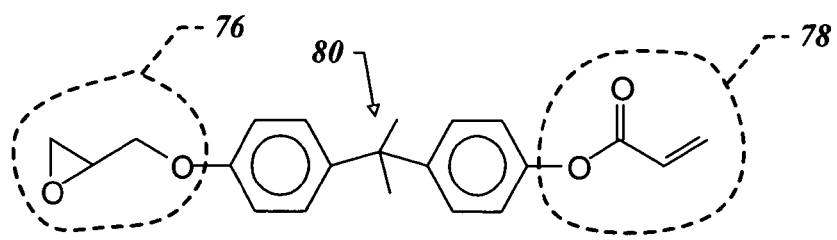
FIG. 9 is a plan view showing the chemical structure of a component of a composition that may be employed to form the primer layer shown in FIGS. 2, 3, and 7, in accordance with a second embodiment of the present invention.

Referring to FIGS. 7 and 9, another multi-functional reactive compound that may be employed to form primer layer 45 in the presence of formation 50 being formed from BULK MATERIAL includes an aromatic bis-phenyl compound available from UCB Chemicals in Smyrna, Ga. under the product name Ebecryl 3605 that has the following structure:

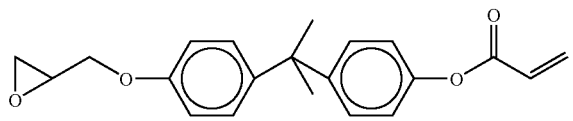

The X' functional group 76 provides epoxy functionality. The X functional group 78 provides acrylate functionality. Functional groups 76 and 78 are coupled to opposing ends of a backbone component 80.

Figure 10:
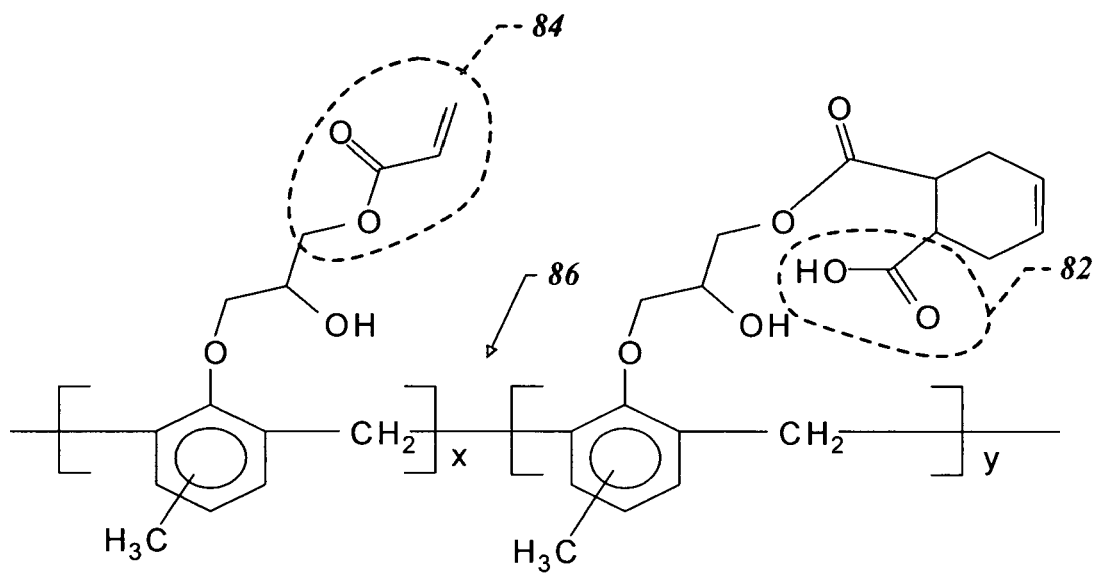
FIG. 10 is a plan view showing the chemical structure of a component of a composition that may be employed to form the primer layer shown in FIGS. 2, 3, and 7, in accordance with a third embodiment of the present invention.

Referring to FIGS. 7 and 10, another multi-functional reactive compound that may be employed to form primer layer 45 in the presence of formation 50 being formed from BULK MATERIAL includes an aromatic compound available from Schenectady International, Inc. in Schenectady, N.Y. under the product name Isorad 501 that has the following structure:

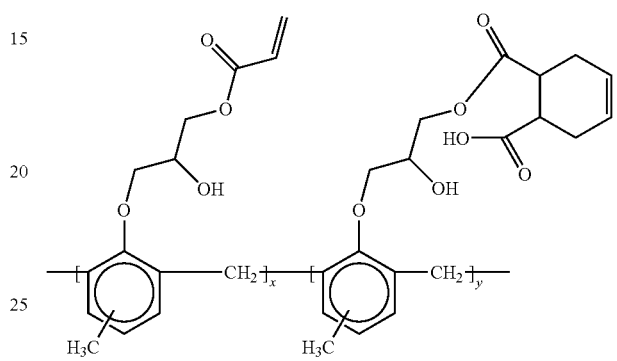

where x and y are integers indicating repeating units that are randomly distributed. The X' functional group 82 provides carboxylic functionality. The X functional group 84 provides acrylate functionality. Functional groups 82 and 84 are coupled to opposing ends of a backbone component 86.

Figure 11:
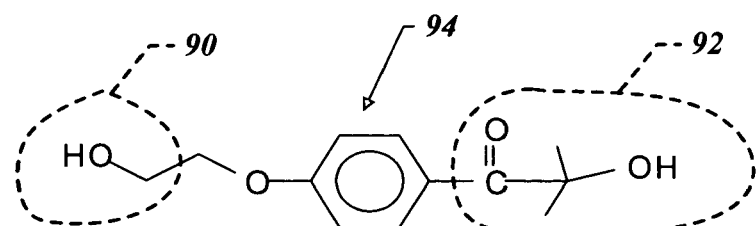
FIG. 11 is a plan view showing the chemical structure of a component of a composition that may be employed to form the primer layer shown in FIGS. 2, 3, and 7, in accordance with a fourth embodiment of the present invention.

Referring to FIGS. 7 and 11, in addition to cross-reaction with formation 50, functional group X may generate radicals that function to facilitate polymerization of the composition from which formation 50 is formed during solidification of the same. As a result, the functional group X would facilitate polymerization of formation 50 upon exposure to actinic energy, e.g., broadband ultraviolet energy. An exemplary multi-functional reactive compound that includes these properties is a photoinitiator available from Ciba Specialty Chemicals in Tarrytown, N.Y. under the tradename Irgacure 2959 and has the following structure:

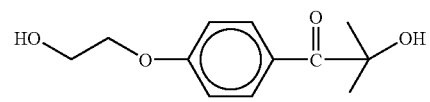

The X' functional group 90 provides hydroxyl functionality. The X functional group 92 provides initiator-type functionality. Specifically, in response to exposure to broadband ultraviolet energy, the functional group X undergoes alpha-cleavage to generate benzoyl type of radicals. The radicals facilitate radical polymerization of the composition from which formation 50 is formed. Functional groups 90 and 92 are coupled to opposing ends of a backbone component 94.

Several compositions were formed, including some of the aforementioned multi-functional reactive compounds, to determine the adhering strength of interfaces 66 and 68. An exemplary composition including a multi-functional reactive compound is as follows:

COMPOSITION 1

β-CEA

DUV30J-16 where DUV30J-16 comprises approximately 100 grams of composition 1 and β-CEA comprises approximately 0.219 grams. DUV30J-16 is a bottom anti-reflective coating, BARC, available from Brewer Science in Rolla, Mo. containing 93% solvent, and 7% non-solvent reactive components. DUV30J-16 contains phenolic resins, and its crosslinker can react with the carboxylic functional group. It is believed that DUV30J-16 will not form covalent bonds with formation 50. In another composition, β-CEA was replaced by a cross-linking agent, a catalyst and IsoRad 501. Both the cross-linking agent and catalyst is sold by Cytec Industries, Inc. of West Patterson, N.J. The cross-linking agent is sold under the product name Cymel 303ULF. One of the main components of Cymel 303ULF is hexamethoxymethyl-melamine (HMMM). The methoxyl functional groups of HMMM can participate in many condensation reactions. The catalyst is sold under the product name Cycat 4040 providing the following composition:

COMPOSITION 2

DUV30J-16

Isorad 501

Cymel 303ULF

Cycat 4040

Approximately 100 grams of COMPOSITION 2 comprises DUV30J-16, 0.611 gram of COMPOSITION 2 comprises IsoRad 501, 0.175 gram of COMPOSITION 2 comprises Cymel 303ULF and 0.008 gram of COMPOSITION 2 comprises Cycat 4040.

Another composition that may be employed as the multi-functional reactive compound omits DUV30J-16. The composition is as follows:

COMPOSITION 3

IsoRad 501

Cymel 303ULF

Cycat

PM Acetate

Composition 3 includes approximately 77 grams of IsoRad 501, 22 grams of Cymel 303ULF and one gram of Cycat 4040. IsoRad 501, Cymel 303ULF and Cycat are combined. The combination of IsoRad 501, Cymel 303ULF and Cycat are then introduced into approximately 1900 grams of PM Acetate. PM Acetate is a product name of a solvent consisting of 2-(1-Methoxy) propyl acetate sold by Eastman Chemical Company of Kingsport, Tenn.

A fourth composition is identical to COMPOSITION 3, excepting for the amount of the constituent components included. For example, COMPOSITION 4 includes approximately 85.2 grams of IsoRad 501, 13.8 grams of Cymel 303ULF and one gram of Cycat 4040. IsoRad 501, Cymel 303ULF and Cycat are combined. The combination of IsoRad 501, Cymel 303ULF and Cycat are then introduced into approximately 1900 grams of PM Acetate.

A fifth composition is identical to COMPOSITION 3, excepting for the amount of the constituent components included. For example, COMPOSITION 5 includes approximately 81 grams of IsoRad 501, 18 grams of Cymel 303ULF and one gram of Cycat 4040. IsoRad 501, Cymel 303ULF and Cycat are combined. The combination of IsoRad 501, Cymel 303ULF and Cycat are then introduced into approximately 1900 grams of PM Acetate.

Each of the five compositions discussed above with respect to primer layer 45, COMPOSITIONs 1-5, are deposited upon substrate 42 employing spin-coating techniques wherein the substrate is rotated at a velocity between 500 and 4,000 revolutions per minute so as to provide a substantially smooth, if not planar layer with uniform thickness. This is followed by exposing the compositions to thermal actinic energy of 180° C. (Celsius) for approximately two minutes.

The five compositions described above, COMPOSITIONs 1-5, were employed, along with IMPRINTING MATERIAL, to generate comparative data of the strength of the adhesion forces of interfaces 66 and 68 which was compared against baseline measuring of a primer layer 45 formed entirely from DUV30J-16, which is not known to form covalent bonds with formation 50 formed from IMPRINTING MATERIAL. To that end, formation 50, formed from BULK IMPRINTING MATERIAL, and primer layer 45, formed from COMPOSITIONS 1-5 and the base line COMPOSITION, were deposited and then solidified between two glass slides (not shown). Each glass slide (not shown) is approximately 1 mm thick, 75×25 mm in the lateral dimension.

Before deposition of primer layer 45 and formation 50 the glass slides (not shown) are cleaned. Specifically each glass slide (not shown) is exposed to Piranha solution ($H_2SO_4$: $H_2O_2$=2.5:1 by volume). The glass slides (not shown) are subsequently rinsed with de-ionized water, sprayed with isopropyl alcohol, and exposed to a stream of fluid for drying, e.g., a stream of nitrogen gas. Thereafter, the glass slides (not shown) are baked at 120° C. (Celsius) for 2 hours.

Primer layer 45 is deposited onto each of the two glass slides (not shown) employing spin-on techniques with a spin speed up to 3000 rpm. Primer layer 45 is laid on the glass slides (not shown) on hot plates at 180° C. for 2 minutes. In other words, each of COMPOSITIONs 1-5, as well as the baseline composition, are solidified, i.e., polymerized and cross-linked, by exposure to thermal energy. Formation is formed employing drop dispense techniques mentioned above. Specifically, BULK IMPRINTING MATERIAL is disposed as a plurality of droplets onto primer layer 45 on one of the two glass slides. The BULK IMPRINTING MATERIAL is then sandwiched between two primer layers 45 by having the primer layer on the two glass slides (not shown) facing one another and contacting BULK IMPRINTING MATERIAL. Typically, a longitudinal axis of one of the two glass slides (not shown) extends orthogonally to the longitudinal axis of the remaining glass slide (not shown). The BULK IMPRINTING MATERIAL is solidified, i.e., polymerized, and cross-linked by exposing the two glass slides (not shown) to actinic energy, such as broadband ultraviolet wavelengths, using a medium pressure mercury UV lamp for 40 seconds at 20 mW/cm2 intensity.

To measure the strength of the adhesion, a four-point bending fixture (not shown) was adopted for the adhesion test and technique, similar to that described in "Measurement of Adhesive Force Between Mold and Photocurable Resin in Imprint Technology" Japanese Journal of Applied Physics, Vol. 41 (2002) pp. 4194-4197. The maximum force/load was taken as the adhesion value. The beam distance of the top and bottom two points is 60 mm. The load was applied at the speed of 0.5 mm per minute. Employing this test, it was determined that delamination occurred at 6.1 pounds of force when primer layer 45 was formed with the baseline composition. A separation force of approximately 6.5 pounds was reached before delamination occurred with primer layer 45 being formed from COMPOSITION 1. A separation force of approximately 9.1 pounds was reached before delamination occurred with primer layer 45 being formed from COMPOSITION 2. When primer layer 45 was formed from each of COMPOSITIONs 3, 4 or 5, one or both of the two glass slides (not shown) failed (broke) before delamination occurred. As a result, forces of up to 11 pounds were measured without delamination being observed. As a result, it is observed that COMPOSITIONs 3, 4 and 5 provide primer layer 45 with superior operational characteristics in that it effectively prevents delamination were lamella layer 60 to have undesirably thin regions or be altogether absent.

The embodiments of the present invention described above are exemplary. Many changes and modifications may be made to the disclosure recited above while remaining within the scope of the invention. For example, the solvent PM Acetate is employed primarily to dissolve the other constituent components of COMPOSITIONs 3, 4 and 5. As a result, many common photo-resist solvents may be employed in lieu of PM Acetate, such as Diethylene Glycol Monoethyl Ether Acetate, Methyl Amyl Ketone or the like. Further, the solid contents of COMPOSITIONs 3, 4 and 5, i.e., IsoRad 501, Cymel 303ULF and Cycat may comprise between 0.1% to 70% of the composition, weight, and more preferably in a range of 0.5% to 10% by weight, with the remaining quantity consisting of the solvent. The solid component of each of COMPOSITIONs 3, 4, and 5 may comprise 50% to 99%, by weight of IsoRad 501, 1% to 50%, by weight of Cymel 303ULF and 0% to 10% by weight of Cycat 4040. The scope of the invention should not, therefore, be limited by the above description, but instead should be determined with reference to the appended claims along with their full scope of equivalents.

What is claimed is:

1. An adhesive composition for adhering a polymerizable material to a solid substrate during polymerization of the polymerizable material, said composition comprising:
    a multi-functional reactive compound having a backbone group and first and second functional groups, wherein said first functional group is selected from a set of functional groups consisting of a carboxylic group and an epoxy group;
    a catalyst; and
    a cross-linker,
    wherein the adhesive composition differs chemically from the polymerizable material,
    with said first functional group being responsive to a first actinic energy to form cross-linked molecules and adhere a subset of said cross-linked molecules to the solid substrate through the first functional group, and said second functional group being responsive to a second actinic energy, differing from said first actinic energy to react with the polymerizable material during polymerization of the polymerizable material.

2. The composition as recited in claim 1 wherein said first actinic energy includes thermal energy.

3. The composition as recited in claim 1 wherein said second actinic energy includes broad band ultraviolet energy.

4. The composition as recited in claim 1 wherein said multi-functional reactive compound has the following structure:

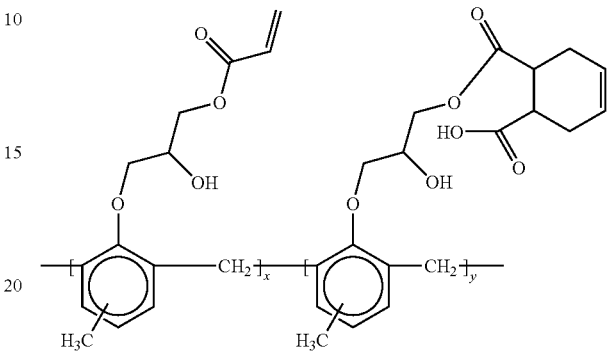

where x and y are integer numbers.

5. The composition as recited in claim 1 wherein said multi-functional reactive compound has the following structure:

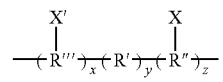

wherein R', R" and R'" are linking groups, X and X' are functional groups, and x, y, z are averaged repeating numbers.

6. The composition as recited in claim 5 wherein said linking groups R', R" and R'" are randomly distributed throughout said multi-functional reactive compound.

7. The composition as recited in claim 1 wherein said first functional group adheres to the solid substrate through an adhering mechanism selected from a set of mechanisms consisting of covalent bonds, ionic bonds, and Van der Waals forces.

8. The composition as recited in claim 1 wherein said cross-linker includes a linking functional group and said first functional group adheres to the solid substrate through said linking functional group of said cross-linker.

9. The composition as recited in claim 1 wherein said second functional group adheres to the polymerizable material by forming covalent bonds therewith during polymerization of the polymerizable material.

10. The composition as recited in claim 1 wherein said second functional group is selected from a set of functional groups consisting of acrylic and vinyl ether.

11. A composition for adhering a polymerizable material to a solid substrate during polymerization of the polymerizable material, said composition comprising:
    a multi-functional reactive compound having a backbone group and first and second functional groups, wherein said first functional group is selected from a set of functional groups consisting of a carboxylic group and an epoxy group;
    a cross-linker; and
    a catalyst,
    with said first functional group being responsive to a first actinic energy to form cross-linked molecules and adhere a subset of said cross-linked molecules to said solid substrate through the first functional group, and said second functional group being responsive to a second actinic energy, differing from said first actinic energy to adhere to said polymerizable material during polymerization of the polymerizable material, wherein the composition differs chemically from the solid substrate and the polymerizable material; and wherein said cross-linker includes a linking functional group and said first functional group adheres to said solid substrate through said linking functional group of the cross-linker.

12. The composition as recited in claim 11 further including a solvent.

13. The composition as recited in claim 11 wherein said second functional group is selected from a set of functional groups consisting of acrylic and vinyl ether.

14. The composition as recited in claim 11 wherein said first functional group adheres to said solid substrate through an adhering mechanism selected from a set of mechanisms consisting of covalent bonds, ionic bonds, and Van der Waals forces.

15. The composition as recited in claim 11 wherein said second functional group adheres to said polymerizable material by forming covalent bonds therewith.

16. A composition for adhering a polymerizable material to a solid substrate during polymerization of the polymerizable material, said composition comprising:

a multi-functional reactive compound having a backbone group and first and second functional groups, with said first functional group providing carboxylic functionality and said second functional group providing acrylic functionality;

a cross-linker;

a catalyst; and a solvent, with said first functional group being responsive to a first actinic energy to form cross-linked molecules and adhere a subset of said cross-linked molecules to said solid substrate through the first functional group, and said second functional group being responsive to a second actinic energy, differing from said first actinic energy to adhere to said polymerizable material during polymerization of the polymerizable material; and wherein the composition differs chemically from the solid substrate and the polymerizable material.

17. The composition as recited in claim 16 wherein said cross-linker includes a linking functional group and said first functional group adheres to said solid substrate through said linking functional group of the cross-linker.

18. The composition as recited in claim 17 wherein said first functional group adheres to said solid substrate through an adhering mechanism selected from a set of mechanisms consisting of covalent bonds, ionic bonds, and Van der Waals forces.

19. An adhesive composition for adhering a polymerizable material to a solid substrate during polymerization of the polymerizable material, said composition comprising:

a multi-functional reactive compound having a backbone group and first and second functional groups, the multi-functional reactive compound having the following structure:

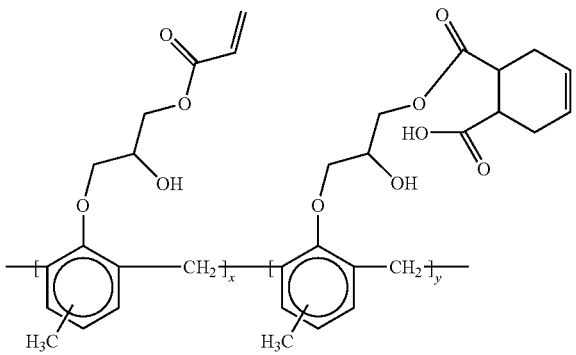

where x and y are integer numbers;

a catalyst; and a cross-linker, with said first functional group being responsive to a first actinic energy to form cross-linked molecules and adhere a subset of said cross-linked molecules to the solid substrate and said second functional group being responsive to a second actinic energy, differing from said first actinic energy to react with the polmerizable material during polymerization of the polymerizable material.

20. An adhesive composition for adhering a polymerizable material to a solid substrate during polymerization of the polymerizable material, said composition comprising:

a multi-functional reactive compound having a backbone group and first and second functional groups X and X', the multi-functional reactive compound having the following structure:

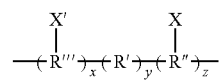

wherein R', R" and R''' are linking groups and x, y, z are averaged repeating numbers;

a catalyst; and a cross-linker, with said first functional group being responsive to a first actinic energy to form cross-linked molecules and adhere a subset of said cross-linked molecules to the solid substrate and said second functional group being responsive to a second actinic energy, differing from said first actinic energy to react with the polymerizable material during polymerization of the polymerizable material.

21. The composition as recited in claim 20, wherein said linking groups R', R" and R''' are randomly distributed throughout said multi-functional reactive compound.

* * * * *